(12) United States Patent
Tai

(10) Patent No.: US 7,804,353 B2
(45) Date of Patent: Sep. 28, 2010

(54) GATE DRIVE CIRCUIT

(75) Inventor: Hiromichi Tai, Saitama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 960 days.

(21) Appl. No.: 11/608,991

(22) Filed: Dec. 11, 2006

(65) Prior Publication Data

US 2007/0187217 A1    Aug. 16, 2007

(30) Foreign Application Priority Data

Feb. 14, 2006    (JP) .............................. 2006-036943

(51) Int. Cl.
*G05F 3/02*    (2006.01)
(52) U.S. Cl. ...................... 327/538; 327/541; 327/551; 361/18; 361/79
(58) Field of Classification Search ................ 327/538, 327/541, 551; 361/18, 79, 118
See application file for complete search history.

(56) References Cited

U.S. PATENT DOCUMENTS 5,821,808 A * 10/1998 Fujima ....................... 327/541
6,903,597 B2    6/2005 Tai
7,535,283 B2 *  5/2009 Kojima ........................ 327/538

FOREIGN PATENT DOCUMENTS

| JP | 2005-86940 | 3/2005 |
|---|---|---|
| WO | WO 2005/027328 A1 | 3/2005 |

* cited by examiner

*Primary Examiner*—Michael B Shingleton
(74) *Attorney, Agent, or Firm*—Oblon, Spivak, McClelland, Maier & Neustadt, L.L.P.

(57) ABSTRACT

The present invention includes: a main voltage detection unit for detecting a voltage applied between main electrodes of an electrical power switching element; a control current source for injecting a current into a gate electrode of the electrical power switching element in accordance with the voltage detected by the main voltage detection unit; a main current detection unit for detecting a main current flowing between the main electrodes of the electrical power switching element; and an adjustment unit for adjusting a current of the control power source in accordance with the main current detected by the main current detection unit.

3 Claims, 4 Drawing Sheets

GATE DRIVE CIRCUIT

BACKGROUND OF THE INVENTION

1. Field of the Invention

The present invention relates to a gate drive circuit for driving an electrical power switching element.

2. Description of the Related Art

Electrical power converters, to which an electrical power switching element is applied, have steadily expanded an application range thereof with development of the switching element having a larger volume and a higher speed. Recently, among such electrical power switching elements, IGBT and MOSFET, which are MOS gate-type switching elements, have particularly expanded the application range thereof.

The IGBT and MOSFET are non-latching-type switching elements, and which do not maintain on/off states thereof. A major advantage of these non-latching-type switching elements is that high controllability is possible by gate drive as compared with a latching-type switching element such as a thyrister. With these non-latching-type switching elements, even during a switching transition between turning on and turning off, a surge voltage and a surge current can be suppressed by gate control, and a gradient of a current or a voltage during the switching transition can be freely controlled.

Application examples, in which characteristics of such non-latching-type switching element are utilized, include a multi-series high-voltage converter with an active gate drive technology. The multi-series high-voltage converter achieves a high-voltage converter which can be used for a high-voltage usage, such as for an electrical power system, by connecting a number of elements, which have limited withstand pressure, in multi-series connections. In the multi-series converter, there is a problem in large dispersion of voltage-sharing is caused by a slight difference of switching timing among the number of elements serially connected. The active gate driving technology is a counter measure against this problem.

FIG. 1 is a circuit configuration diagram of a conventional gate drive circuit. This gate drive circuit is disclosed in Japanese Patent Application No. 2005-86940. A gate electrode, which is a control input terminal of a switching element 9, is connected to a voltage amplifier 5 through a gate resistor 3, and is also connected to an output of a control current source 6. An input of the control current source 6 is connected to an output of a voltage amplifier 2. A collector-to-emitter voltage of the switching element 9, which is divided by resistors 4a and 4b for dividing a voltage, is applied to the input of the voltage amplifier 2. In a normal operation state, the switching element 9 carries out on/off operations according to a gate signal applied through the voltage amplifier 5. However, in a case where a surge voltage is caused at the time when the switching element 9 is turned off, an output current of the control current source 6 increases. A gate voltage of the switching element 9 rises due to a current flowing from the control current source 6 into a gate terminal of the switching element 9. With this, a collector current of the switching element 9 increases. As a result, a collector voltage of the switching element 9 decreases. With such operation, the surge voltage of the switching element 9 is suppressed.

The gate drive circuit shown in FIG. 1 suppresses generation of the surge voltage by feedback control over a main voltage $V_{ce}$ of the switching element in the gate drive circuit. Such a method does not require any main circuit element except for a switching element. Thus, there is an advantage that a circuit configuration is simple. However, since the switching element needs to share all losses, there is a problem that an element loss increases.

By referring to FIGS. 2 and 3, this problem will be described below in detail.

In FIG. 2, a collector current $I_c$ begins to slightly decline during a period T1. A collector voltage rises in proportion to a time derivative value of the collector current. Accordingly, during the period T1, the collector voltage rapidly rises. When the collector voltage $V_{ce}$ reaches at a certain constant value, an active gate drive circuit for suppressing a peak surge voltage begins the operations, and the collector voltage is controlled to be suppressed at a constant value. This period is defined as a period T2. Since the collector voltage is constant, a time derivative value of the collector current is also a constant value. As a result, the collector current linearly decreases. When the collector current is substantially zero, the period T2 is terminated. During a period T3, the collector current is substantially zero, and the collector voltage rapidly converges to a power supply voltage $V_{dc}$.

On the other hand, FIG. 3 shows waveforms of the collector current and of a collector-to-emitter voltage in a case where an active gate is not used. In this case, the period T2 in FIG. 2 is not present. During the period T1, the collector-to-emitter voltage $V_{ce}$ rises in proportion to the time derivative value of the collector current $I_c$ as the collector current $I_c$ decreases. After that, the collector-to-emitter voltage $V_{ce}$ reaches a peak, and rapidly declines when the collector current $I_c$ reaches substantially zero, the collector-to-emitter voltage $V_{ce}$ being a value substantially equal to that of the power supply voltage $V_{dc}$. At this time, the period T1 is terminated to proceed to a period T3.

In a case where the active gate drive is not used, a circuit element and control circuit for suppressing the collector-to-emitter voltage $V_{ce}$, are not present. Accordingly, in a case where inductance of a main circuit is large, the collector-to-emitter voltage exceeds an acceptable maximum value during the period T1 in FIG. 3, and the switching element is broken. An object of applying the active gate drive is to prevent the switching element from being broken with control for suppressing the peak voltage.

In a case where a peak surge voltage is suppressed by the active gate drive technology, an excessive loss is generated during the period of suppressing the surge voltage at the time when the switching element is turned off. The period T2 in FIG. 2 corresponds to the above period. During the period T2, the active gate circuit operates so that the collector voltage can be clamped at a constant value. The collector voltage at the time when the switching element is turned off is proportional to $dI_c/dt$, which is a time derivative value of the collector current $I_c$. Accordingly, $dI_c/dt$ during the period T2, that is, gradient of the collector current $I_c$ is at a constant value. When the collector-to-emitter voltage during this period T2 is defined as $V_{cep1}$, a direct current power supply voltage as $V_{dc}$, and a component of parasitic inductance of the main circuit as $L_s$, the following relation is formed.

$$V_{cep1} - V_{dc} = -L_s \times \frac{dI_c}{dt}$$

Hence, when it is supposed that an element loss during the period T2 is defined as $E_2$, a time width of the period T2 as $t_2$, a maximum value of the collector current as $I_{cp1}$, and a tail current is sufficiently small, the following relation is formed.

$$E_2 = \frac{1}{2}V_{cep1} \times I_{cp1} \times t_2 = \frac{1}{2}V_{cep1} \times I_{cp1}^2 \times \frac{L_s}{V_{cep1} - V_{dc}} = \frac{1}{2}L_s \times I_{cp1}^2 \times \frac{V_{cep1}}{V_{cep1} - V_{dc}}$$

That is, the element loss during the period T2 is proportional to the square of maximum value $I_{cp1}$ of the collector current. In addition, the element loss dramatically increases as the collector-to-emitter voltage $V_{cep1}$ of the turned-off period is closer to the power supply voltage $V_{dc}$.

SUMMARY OF THE INVENTION

An object of the present invention is to provide a gate drive circuit for suppressing an increase of an element loss while carrying out surge voltage suppression with an active gate drive technology.

A first aspect of the present invention is a gate drive circuit for driving a gate electrode of an electrical power switching element. The gate drive circuit includes a main voltage detection unit for detecting a voltage applied between main electrodes of the electrical power switching element; a control current source for injecting a current into the gate electrode depending on the voltage detected by the main voltage detection unit; a main current detection unit for detecting a main current flowing between the main electrodes of the electrical power switching element; and an adjustment unit for adjusting the current of the control current source depending on the main current detected by the main current detection unit.

A second aspect of the present invention is a gate drive circuit for driving a gate electrode of an electrical power switching element. The gate drive circuit includes a main voltage detection unit for detecting a voltage applied between main electrodes of the electrical power switching element; a control current source for injecting a current into the gate electrode depending on the voltage detected by the main voltage detection unit; a gate voltage detection unit for detecting a voltage of the gate electrode of the electrical power switching element; and an adjustment unit for adjusting the current of the control current source depending on the voltage of the gate electrode which is detected by the gate voltage detection unit.

A third aspect of the present invention is a gate drive circuit for driving a gate electrode of an electrical power switching element. The gate drive circuit includes a main voltage detection unit for detecting a voltage applied between main electrodes of the electrical power switching element; a control current source for injecting a current into the gate electrode in accordance with the voltage detected by the main voltage detection unit; a gate resistor connected to the gate electrode of the electrical power switching element; a gate current detection unit for detecting a gate current flowing through the gate resistor; and an adjustment unit for adjusting a current of the control current source depending on the gate current detected by the gate current detection unit.

According to the first, second, and third aspects of the present invention, by applying the active gate drive technology, not only a surge voltage applied to the switching element can be suppressed but also adjustment unit adjusts a current of the control current source depending on the main current flowing between the main electrodes of the switching element. Thereby, a suppression value of the surge voltage can be varied depending on the adjusted current. Thus, an increase of switching element loss can be suppressed in spite of the application of the active gate drive technology.

DESCRIPTION OF THE PREFERRED EMBODIMENTS

By referring to drawings, several embodiments of gate drive circuits of the present invention will be described in detail below.

First Embodiment

Figure 1:
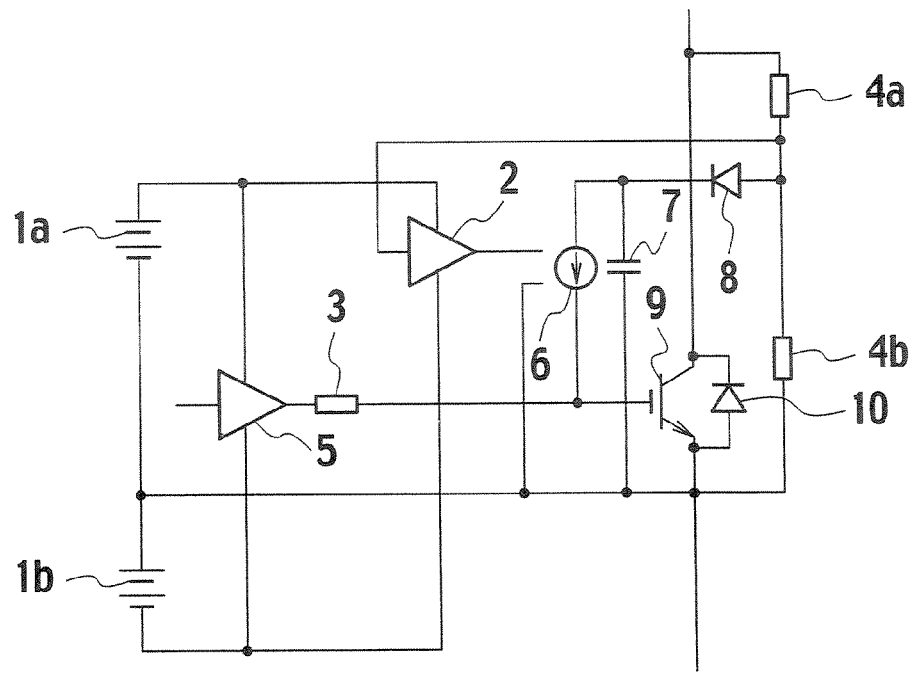
FIG. 1 is a circuit configuration diagram of a conventional gate drive circuit.
Figure 4:
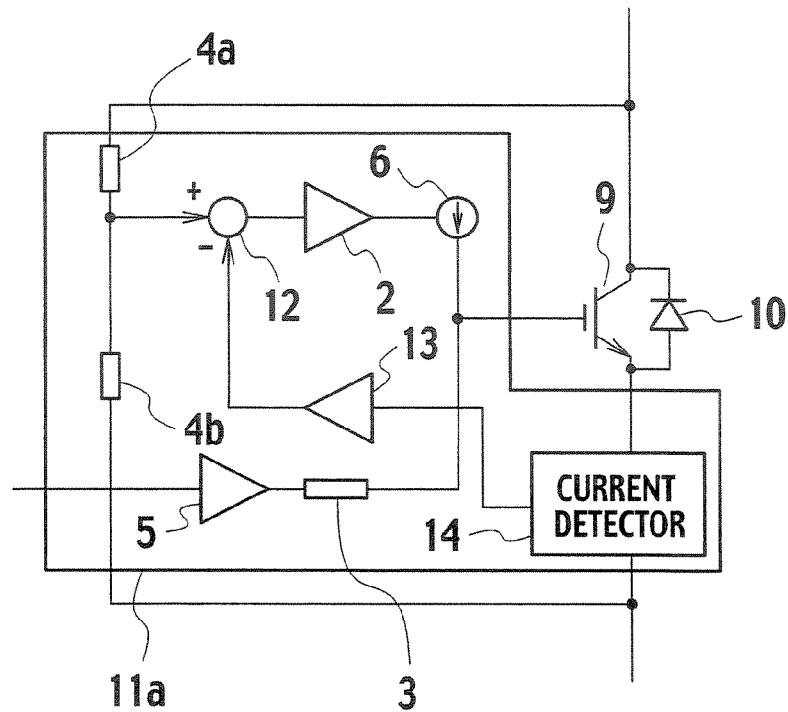
FIG. 4 is a circuit configuration diagram of a gate drive circuit of a first embodiment.

FIG. 4 is a circuit configuration diagram of a gate drive circuit of a first embodiment. A gate drive circuit 11a drives a switching element 9. The gate drive circuit 11a has a voltage amplifier 13, an adder 12, and a current detector 14 in addition to the configuration of FIG. 1.

The current detector 14 corresponds to a main current detection unit of the present invention, and one end thereof is connected to an emitter of the switching element 9. The current detector 14 detects a collector current flowing through the switching element 9, and outputs a voltage, which is proportional to the detected current, to the voltage amplifier 13. The voltage amplifier 13 amplifies the voltage outputted from the current detector 14, and outputs the resultant voltage to an inverting input terminal of the adder 12.

Resistors 4a and 4b for dividing a voltage are connected to each other in series between a collector of the switching element 9 and the other end of the current detector 14. The serially connected resistors 4a and 4b correspond to main voltage detection unit of the present invention, and a collector-to-emitter voltage $V_{ce}$ of the switching element 9 is divided with the resistors 4a and 4b, and is outputted to a non-inverting input terminal of the adder 12.

The adder 12 corresponds to adjustment unit of the present invention, and subtracts a voltage from the voltage amplifier 13 from a voltage $V_{ce}$, which is divided by the resistors 4a and 4b, and outputs an obtained difference voltage to a voltage amplifier 2. The voltage amplifier 2 amplifies the difference voltage from the adder 12, and outputs the resultant voltage to a control current source 6. The control current source 6 adjusts a current amount depending on the difference voltage amplified by the voltage amplifier 2, and applies a current to a gate terminal of the switching element 9.

Next, operations of the first embodiment configured as described above will be described. An output voltage of the current detector 14 is proportional to a collector current of the switching element 9. For this reason, the larger the collector current of the switching element 9 is, the higher the output voltage of the voltage amplifier 13 is. Accordingly, by the operations of the adder 12, the larger the collector current of the switching element 9 is, the smaller an output of the voltage amplifier 2 is for the same output of the partial pressure. Conversely, in order for the control current source 6 to pour a constant current into the gate of the switching element 9, the larger the collector current is, the larger a collector-to-emitter voltage needs to be.

That is, the larger the collector current is, the higher a clamp level of the collector voltage is, the clamp level being determined by the active gate drive circuit.

Figure 6:
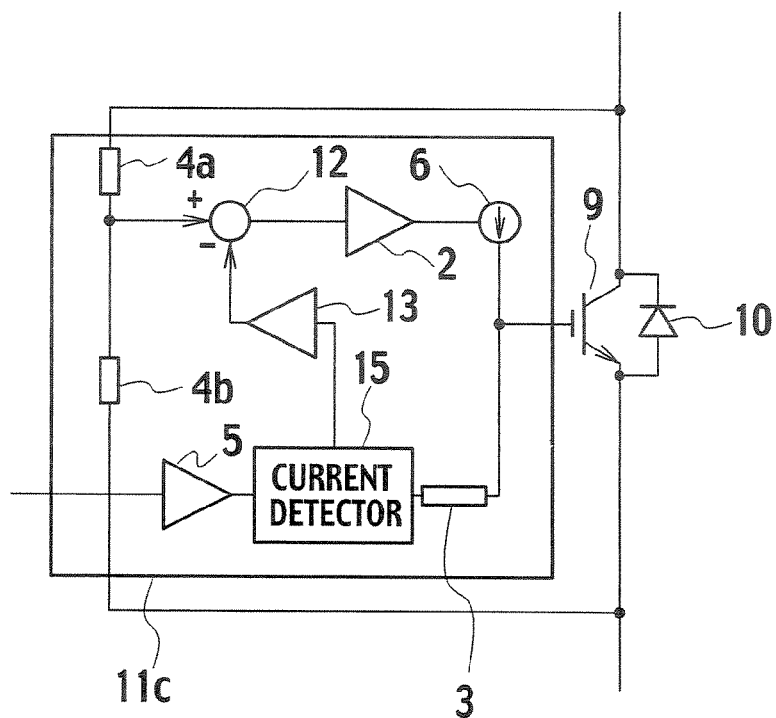
FIG. 6 is a circuit configuration diagram of a gate drive circuit of a third embodiment.

Accordingly, in the first embodiment, in a case where the collector current shows a high value such as $I_{cp2}$ in FIG. 6, a circuit configuration in which a collector voltage also shows a high value such as $V_{cep2}$, is adopted. From the formula (2), it is indicated that an element loss is suppressed due to a larger difference between $V_{cep2}$ and $V_{dc}$.

Figure 2:
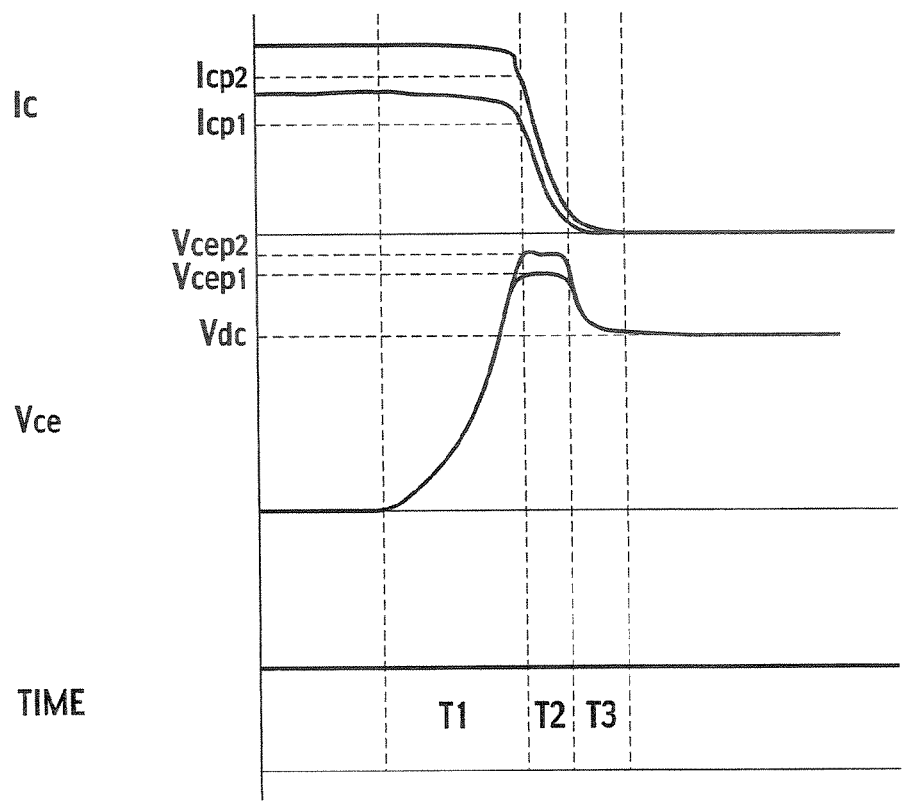
FIG. 2 is a graph for describing an element loss in the conventional gate drive circuit.
Figure 3:
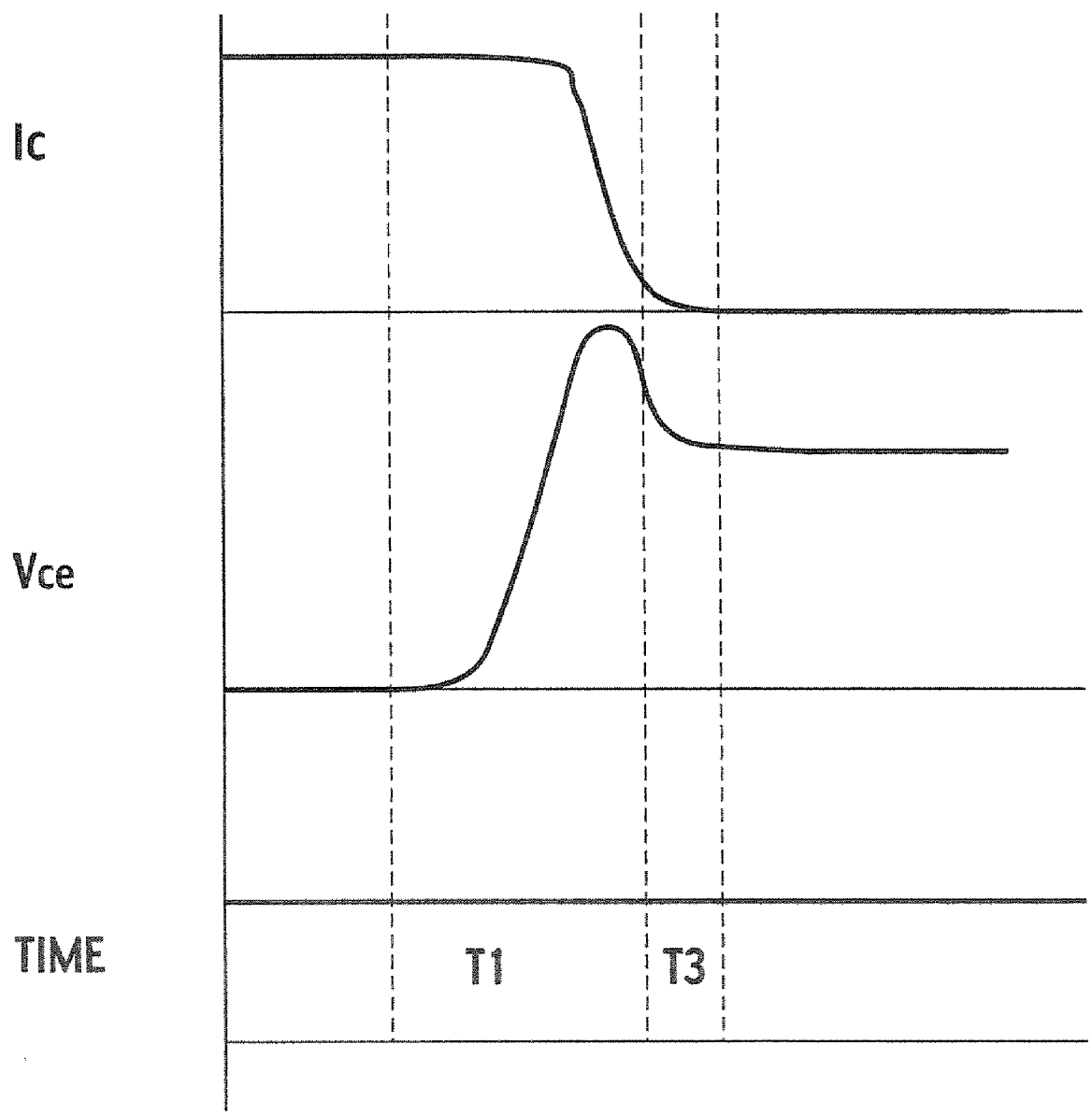
FIG. 3 is a graph for describing the element loss in a case where an active gate drive is not applied in the conventional gate drive circuit.

In a case of the conventional technology, in FIG. 2, the peak value of the collector voltage remains $V_{cep1}$ even when the collector current is $I_{cp1}$ or $I_{cp2}$ at the time when the switching element is turned off. Accordingly, the loss increases in a case where the collector current increases. In the present invention, the peak value of the collector voltage increases from $V_{cep1}$ to $V_{cep2}$ as the collector current increases. Thus, an increase of the element loss is suppressed.

In this manner, according to the gate drive circuit of the first embodiment, while the active gate drive circuit is provided with a function of suppressing a surge voltage, the increase of the element loss can be concurrently suppressed since the larger the collector current is, the more the clamp level of the collector voltage rises.

Second Embodiment

Figure 5:
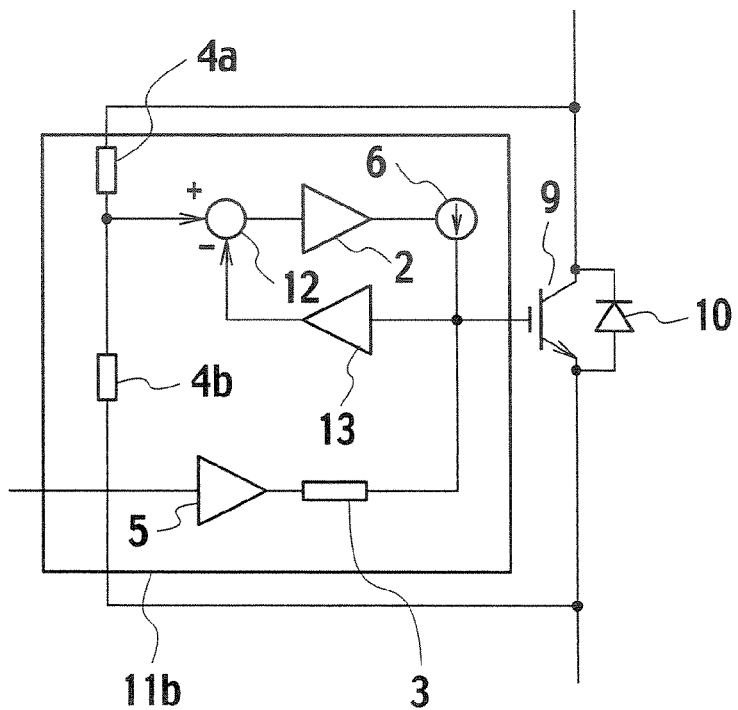
FIG. 5 is a circuit configuration diagram of a gate drive circuit of a second embodiment.

FIG. 5 is a circuit configuration diagram of a gate drive circuit of a second embodiment. With the configuration of the first embodiment, the collector current of the switching element 9 is directly detected by the current detector 14. However, there is a case where a current detector is often expensive, and where the size thereof is large. In the configuration of the gate drive circuit of the second embodiment shown in FIG. 5, a collector current is indirectly detected by a gate voltage of the switching element 9, in place of the current detector 14.

A gate electrode of the switching element 9 corresponds to gate voltage detection unit of the present invention, and is connected to an input of a voltage amplifier 13. The voltage amplifier 13 amplifies a gate voltage of the switching element 9, and outputs the resultant voltage to an inverting input terminal of an adder 12.

Next, operations of the second embodiment configured as described above will be described. The gate voltage of the switching element 9 is larger in proportion to a collector current in the transition period where the switching element is turned off. More precisely, values of a collector current are expressed with a squared curve drawn against a line expressing values of the gate voltage. Hence, in FIG. 5, during the transition period where the element is turned off, the larger the collector current is, the higher an input/output voltage of the voltage amplifier 13 inside the gate drive circuit 11b is. Accordingly, an output voltage of the adder 12 is smaller even when an output of a voltage divider, which is constituted by resistors 4a and 4b, is equal. That is, the larger the collector current is, the lower an input voltage of a control current source 6 for the same collector-to-emitter voltage is. This represents the fact that the larger the collector current is, the higher a clamp level of the collector voltage is, the clamp level being determined by an active gate drive circuit.

As described above, according to the gate drive circuit of the second embodiment, while the active gate drive circuit is provided with a function of suppressing a surge voltage, an increase of the element loss can be concurrently suppressed without using an expensive current detector since the larger the collector current is, the more a clamp level of the collector voltage rises.

Third Embodiment

The gate drive circuit of the second embodiment indirectly detects the collector current of the switching element 9 with a gate voltage. However, in a number of large electrical power elements, a gate voltage takes a value in a relatively wider range of +15V to −15V. For this reason, there is a case where a somewhat complicated electronic circuit is needed in order to detect a gate voltage. In contrast, in a gate drive circuit of a third embodiment shown in FIG. 6, a gate voltage is not directly used. Instead, a collector current is indirectly detected based on a current flowing through a gate resistor.

A current detector 15 corresponds to gate current detection unit of the present invention, and one end thereof is connected to a gate terminal of a switching element 9 through a gate resistor 3. The other end of the current detector 15 is connected to an output terminal of a voltage amplifier 5. With this, the current detector 15 outputs a voltage, which is proportional to the detected current value of the gate current, to a voltage amplifier 13. The voltage amplifier 13 amplifies the voltage outputted from the current detector 15, and outputs the resultant voltage to an inverting input terminal of an adder 12.

Next, operations of the third embodiment configured as described above will be described. In a process of causing the switching element 9 to be turned off, a larger current flowing through the gate resistor 3 causes a voltage of an inverting input of the adder 12 to be higher, and an input voltage of a control current source 6 to be lower. At the time when the switching element 9 is turned off, an output voltage of the voltage amplifier 5 is a minimum value, which is negative. For this reason, the higher the gate voltage of the switching element 9 is, the larger the current flowing through the gate resistor 3 is. Accordingly, the larger the collector current of the switching element 9 is, the higher the gate voltage is as well as the larger the current flowing through the gate resistor 3. As a result, an output current of the control current source 6 is smaller. That is, the larger the collector current is, the higher a clamp level of the collector voltage is, the clamp level being determined by an active gate drive circuit.

As described above, according to the gate drive circuit of the third embodiment, while the active gate drive circuit is provided with a function of suppressing a surge voltage, an increase of the element loss can be concurrently suppressed without using the gate voltage detection circuit since the larger the collector current is, the higher the clamp level is.

Fourth Embodiment

Figure 7:
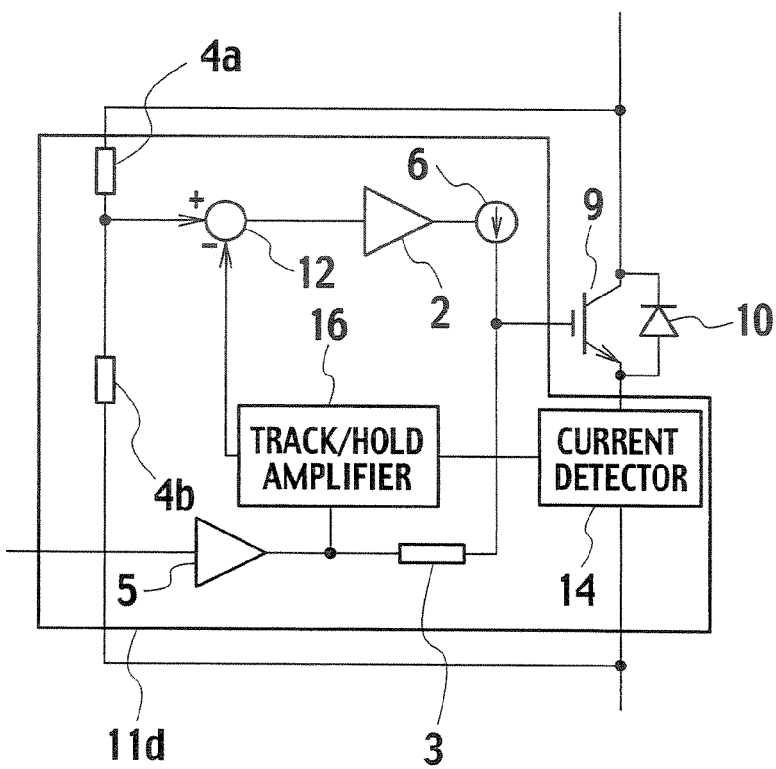
FIG. 7 is a circuit configuration diagram of a gate drive circuit of a fourth embodiment.

FIG. 7 is a circuit configuration diagram of a gate drive circuit of a fourth embodiment. In the first to third embodiments, a voltage based on the detected collector current of the switching element 9 is inputted to the adder 12. However, an object of feedback of the collector current is to adjust an operation level of the active gate in accordance with a magnitude of the collector current at the time just before the switching element 9 is turned off. Thus, the active gate operation is more stabilized by adjusting the operation level thereof not by a collector current value during the transition period where the switching element 9 is turned off, but by a collector current value just before the switching element 9 is turned off.

To this end, in a gate drive circuit lid of the fourth embodiment shown in FIG. 7, a track/hold amplifier 16 is used. The track/hold amplifier 16 corresponds to output track/hold unit of the present invention, and is connected to a gate electrode of the switching element 9 through a gate resistor 3. The track/hold amplifier 16 monitors on/off signals of the switching element 9. A current detector 14 outputs a voltage, which is proportional to the detected collector current, to an input terminal of the track/hold amplifier 16. The track/hold amplifier 16 follows or holds the outputted voltage of the current detector 14 in accordance with the on/off signals of the switching element 9, and outputs the voltage to an inverting input terminal of the adder 12.

Next, operations of the fourth embodiment configured as described above will be described. While an on-signal is applied to the switching element 9, the track/hold amplifier 16 operates in a track mode in accordance with an output voltage of the voltage amplifier 5, and inputs a signal, which is proportional to the output voltage of the current detector 14, to the adder 12. When the off-signal is applied to the switching element 9, the mode of the track/hold amplifier 16 is changed over to a hold mode, and the track/hold amplifier 16 holds a signal level proportional to the output voltage of the current detector 14 at the time when the off-signal is applied. Thereafter, the track/hold amplifier 16 inputs the signal level to the adder 12. In this manner, the larger the collector current of the switching element 9 is, the more the clamp level of the collector voltage rises. Accordingly, an increase of the loss can be suppressed.

As described above, according to the gate drive circuit of the fourth embodiment, even when the switching element 9 is in the transition period of being turned off, the track/hold amplifier 16 holds a voltage which is in accordance with the magnitude of the main current at the time just before the switching element 9 is turned off. Thus, an operation level of the active gate can be adjusted according to the held voltage. Accordingly, the active gate operation can be carried out more stably.

In the first to fourth embodiments, IGBT, for example, is used as a switching element. In addition, a switching element is not limited to IGBT. Any non-latching-type switching element (for example, MOSFET or the like), which is controlled by a voltage, can be applied to the present invention.

The present invention can be used for gate drive of an electrical power switching element used in a power converter circuit.

What is claimed is:

1. A gate drive circuit for driving a gate electrode of an electrical power switching element, comprising:
   a main voltage detection unit for detecting a voltage applied between main electrodes of the electrical power switching element;
   a control current source for injecting a current into the gate electrode in accordance with the voltage detected by the main voltage detection unit;
   a main current detection unit for detecting a main current flowing between the main electrodes of the electrical power switching element; and
   an adjustment unit for adjusting the current of the control current source in accordance with the main current detected by the main current detection unit.

2. The gate drive circuit according to claim 1, wherein the adjustment unit includes an operation unit for outputting, to the control current source, a difference voltage obtained by subtracting a voltage, which is proportional to the main current detected by the main current detection unit, from the voltage detected by the main voltage detection unit.

3. The gate drive circuit according to claim 2, wherein the adjustment unit includes an output track/hold unit for following or holding an output of the main current detection unit depending on whether the electrical power switching element is turned on or off, and for outputting the output to an inverting input terminal of the operation unit.

* * * * *